(12) United States Patent
Furuta

(10) Patent No.: US 11,548,096 B2
(45) Date of Patent: Jan. 10, 2023

(54) LASER PROCESSING APPARATUS

(71) Applicant: DISCO CORPORATION, Tokyo (JP)

(72) Inventor: Kenji Furuta, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 703 days.

(21) Appl. No.: 16/446,176

(22) Filed: Jun. 19, 2019

(65) Prior Publication Data

US 2019/0389008 A1 Dec. 26, 2019

(30) Foreign Application Priority Data

Jun. 20, 2018 (JP) .............................. JP2018-116663

(51) Int. Cl.
*B23K 26/364* (2014.01)
*G02B 19/00* (2006.01)
(Continued)

(52) U.S. Cl.
CPC ........ *B23K 26/364* (2015.10); *B23K 26/0604* (2013.01); *B23K 26/066* (2015.10);
(Continued)

(58) Field of Classification Search
CPC .............. B23K 26/064; B23K 26/0643; B23K 26/066; B23K 26/067; B23K 26/53;
(Continued)

(56) References Cited

U.S. PATENT DOCUMENTS 6,127,647 A * 10/2000 Matsuo .............. B23K 26/0673
219/121.64
7,072,566 B2 * 7/2006 Seo ...................... B23K 26/066
219/121.61
(Continued)

FOREIGN PATENT DOCUMENTS

JP 2002192370 A 7/2002
JP 2010260063 A * 11/2010
(Continued)

OTHER PUBLICATIONS

DE App. 10 2019 208 936.4: Office Action (translation) dated Jan. 20, 2022 (5 pages).

*Primary Examiner* — John J Norton
(74) *Attorney, Agent, or Firm* — Greer, Burns & Crain, Ltd.

(57) ABSTRACT

A laser beam applying unit of a laser processing apparatus for processing a wafer includes a laser oscillator for emitting a pulsed laser beam having a wavelength transmittable through the wafer, a beam condenser for converging the pulsed laser beam emitted from the laser oscillator onto the wafer held on a chuck table, a beam splitter assembly disposed between the laser oscillator and the beam condenser, for splitting the pulsed laser beam emitted from the laser oscillator to form at least two converged spots on the wafer that are spaced from each other in X-axis directions, and a mask assembly disposed between the laser oscillator and the beam condenser, for reducing the width of the converged spots on the wafer in Y-axis directions to keep the converged spots on the wafer within the width of the projected dicing lines on the wafer.

19 Claims, 4 Drawing Sheets

(51) Int. Cl.
  *G02B 27/28* (2006.01)
  *B23K 26/06* (2014.01)
  *B23K 26/53* (2014.01)
  *B23K 26/066* (2014.01)
  *B23K 101/40* (2006.01)
  *H01L 21/67* (2006.01)

(52) U.S. Cl.
  CPC ...... B23K 26/0648 (2013.01); B23K 26/0665 (2013.01); B23K 26/53 (2015.10); G02B 19/0047 (2013.01); G02B 27/283 (2013.01); *B23K 2101/40* (2018.08); *H01L 21/67092* (2013.01)

(58) Field of Classification Search
  CPC ............ B23K 2103/56; B23K 26/0604; B23K 26/0648; B23K 26/0665; B23K 26/0676; B23K 26/364; B23K 2101/40; G02B 19/0047; G02B 27/283; H01L 21/67092
  See application file for complete search history.

(56) References Cited

U.S. PATENT DOCUMENTS

| | | | | |
|---|---|---|---|---|
| 9,085,046 B2 * | 7/2015 | Nomaru | ............... | B23K 26/064 |
| 2004/0043310 A1 * | 3/2004 | Takeishi | ................... | G21K 5/10 |
| | | | | 430/394 |
| 2004/0070820 A1 * | 4/2004 | Nishimura | ........... | B23K 26/067 |
| | | | | 359/359 |
| 2004/0118823 A1 * | 6/2004 | Groen | ............... | B23K 26/0648 |
| | | | | 219/121.69 |
| 2005/0059265 A1 * | 3/2005 | Im | ....................... | H01L 21/268 |
| | | | | 438/150 |
| 2005/0247682 A1 * | 11/2005 | Kuroiwa | ............ | B23K 26/0604 |
| | | | | 219/121.73 |
| 2008/0055588 A1 * | 3/2008 | Nomaru | ............ | B23K 26/0643 |
| | | | | 356/73 |
| 2008/0105665 A1 * | 5/2008 | Kondo | ................. | B23K 26/082 |
| | | | | 219/121.77 |
| 2008/0170291 A1 * | 7/2008 | Nakamae | ............ | B23K 26/066 |
| | | | | 359/362 |
| 2010/0025387 A1 * | 2/2010 | Arai | .................... | B29C 65/1635 |
| | | | | 219/121.69 |
| 2010/0084386 A1 | 4/2010 | Masuda et al. | | |
| 2010/0317172 A1 * | 12/2010 | Morikazu | .......... | B23K 26/0853 |
| | | | | 219/121.68 |
| 2011/0134525 A1 * | 6/2011 | Holmgren | ........... | B23K 26/067 |
| | | | | 359/489.08 |
| 2011/0240611 A1 * | 10/2011 | Sandstrom | ........... | B23K 26/082 |
| | | | | 219/121.61 |
| 2012/0223061 A1 * | 9/2012 | Atsumi | .................. | B23K 26/53 |
| | | | | 219/121.72 |
| 2012/0322242 A1 * | 12/2012 | Lei | .......................... | H01L 21/78 |
| | | | | 438/462 |
| 2013/0196464 A1 * | 8/2013 | Viatella | ................... | H01L 31/18 |
| | | | | 438/57 |
| 2013/0334185 A1 * | 12/2013 | Nomaru | ............. | B23K 26/0676 |
| | | | | 219/121.82 |
| 2014/0299586 A1 * | 10/2014 | Sawabe | .................. | B23K 26/04 |
| | | | | 219/121.67 |
| 2016/0035603 A1 * | 2/2016 | Ikenoue | ............... | B23K 26/354 |
| | | | | 219/121.65 |
| 2017/0120374 A1 * | 5/2017 | Hendricks | ............ | B23K 26/53 |
| 2017/0326688 A1 * | 11/2017 | Turner | ................. | B23K 26/382 |
| 2019/0135678 A1 * | 5/2019 | Liu | .................... | B23K 26/0617 |

FOREIGN PATENT DOCUMENTS

| | | | | |
|---|---|---|---|---|
| JP | 2010284669 A | * | 12/2010 | ......... B23K 26/0608 |
| JP | 2011092956 A | * | 5/2011 | |
| JP | 2013197108 A | | 9/2013 | |
| JP | 2016107330 A | * | 6/2016 | ............ B23K 26/03 |
| JP | 2016107330 A | | 6/2016 | |
| JP | 2016129203 A | | 7/2016 | |

\* cited by examiner

LASER PROCESSING APPARATUS

BACKGROUND OF THE INVENTION

Field of the Invention

The present invention relates to a laser processing apparatus for forming modified layers in a wafer with a plurality of devices formed on a face side thereof in respective areas thereon demarcated by a grid of intersecting projected dicing lines.

Description of the Related Art

Wafers with a plurality of devices such as integrated circuits (ICs), large scale integration (LSI) circuits, etc. formed on face sides thereof in respective areas demarcated by a grid of intersecting projected dicing lines are divided into individual device chips by a dicing apparatus, also referred to as a dicing saw, and the device chips will be used in electric appliances such as mobile phones, personal computers, and so on.

There has been proposed a technology in which a laser beam is applied to a wafer while its focal point is positioned in the wafer along and beneath a grid of projected dicing lines on a face side thereof to form modified layers in the wafer along the projected dicing lines, and the wafer is divided into individual device chips from the modified layers along the projected dicing lines (see, for example, Japanese Patent No. 3408805). The proposed technology is advantageous in that it can produce many device chips from one wafer by reducing the width of the projected dicing lines from 50 µm to 10 µm, for example.

SUMMARY OF THE INVENTION

However, when the laser beam is applied to the wafer from the face side thereof with the focal point positioned in the wafer, the laser beam applied to the wafer tends to have its spot positioned on the face side across and beyond the width of the projected dicing lines, possibly causing damage to devices disposed adjacent to the projected dicing lines.

Furthermore, when a laser beam is applied to a wafer from a reverse side thereof at regions corresponding to projected dicing lines on a face side of the wafer with its focal point positioned in the wafer, a leaked beam after having formed modified layers in the wafer is liable to damage devices formed on the face side of the wafer.

It is therefore an object of the present invention to provide a laser processing apparatus which will not cause damage to devices on a wafer when a laser beam is applied to the wafer while positioning its focal point in the wafer along and behind a grid of comparatively narrow projected dicing lines on the wafer.

In accordance with an aspect of the present invention, there is provided a laser processing apparatus for forming modified layers in a wafer with a plurality of devices formed on a face side thereof in respective areas demarcated thereon by a grid of intersecting projected dicing lines, including: a chuck table holding a wafer thereon; a laser beam applying unit applying a pulsed laser beam to the wafer held on the chuck table to form modified layers in the wafer; an X-axis feeding mechanism processing-feeing the chuck table and the laser beam applying unit relative to each other in an X-axis direction; and a Y-axis feeding mechanism indexing-feeing the chuck table and the laser beam applying unit relative to each other in a Y-axis direction perpendicular to the X-axis direction, in which the laser beam applying unit includes a laser oscillator for emitting a pulsed laser beam having a wavelength transmittable through the wafer, a beam condenser for converging the pulsed laser beam emitted from the laser oscillator onto the wafer held on the chuck table, a beam splitter assembly disposed between the laser oscillator and the beam condenser, for splitting the pulsed laser beam emitted from the laser oscillator to form at least two converged spots on the wafer that are spaced from each other in the X-axis direction, and a mask assembly disposed between the laser oscillator and the beam condenser, for reducing a width of the converged spots on the wafer in the Y-axis direction to keep the converged spots on the wafer within a width of the projected dicing lines on the wafer.

Preferably, a distance between the at least two converged spots is set to a distance by which cracks extending in the X-axis direction from adjacent modified layers are joined together. Preferably, the pulsed laser beam to be split has a pulse energy level ranging from 12 to 15 µJ, and the pulsed laser beam is split by the beam splitter assembly to form two converged spots on the wafer. Preferably, if the distance between the two converged spots ranges from 5 to 6 µm, a processing feed rate at which the chuck table and the laser beam applying unit are fed relative to each other by the X-axis feeding mechanism is represented by V (mm/s), and a repetitive frequency of the pulsed laser beam is represented by R (kHz), then V/R is in the range of the distance between the converged spots×1.4≤V/R≤the distance between the converged spots×2.

According to the present invention, the laser processing apparatus will not cause damage to devices on a wafer when a laser beam is applied to the wafer while positioning its focal point in the wafer along and beneath a grid of comparatively narrow projected dicing lines on the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
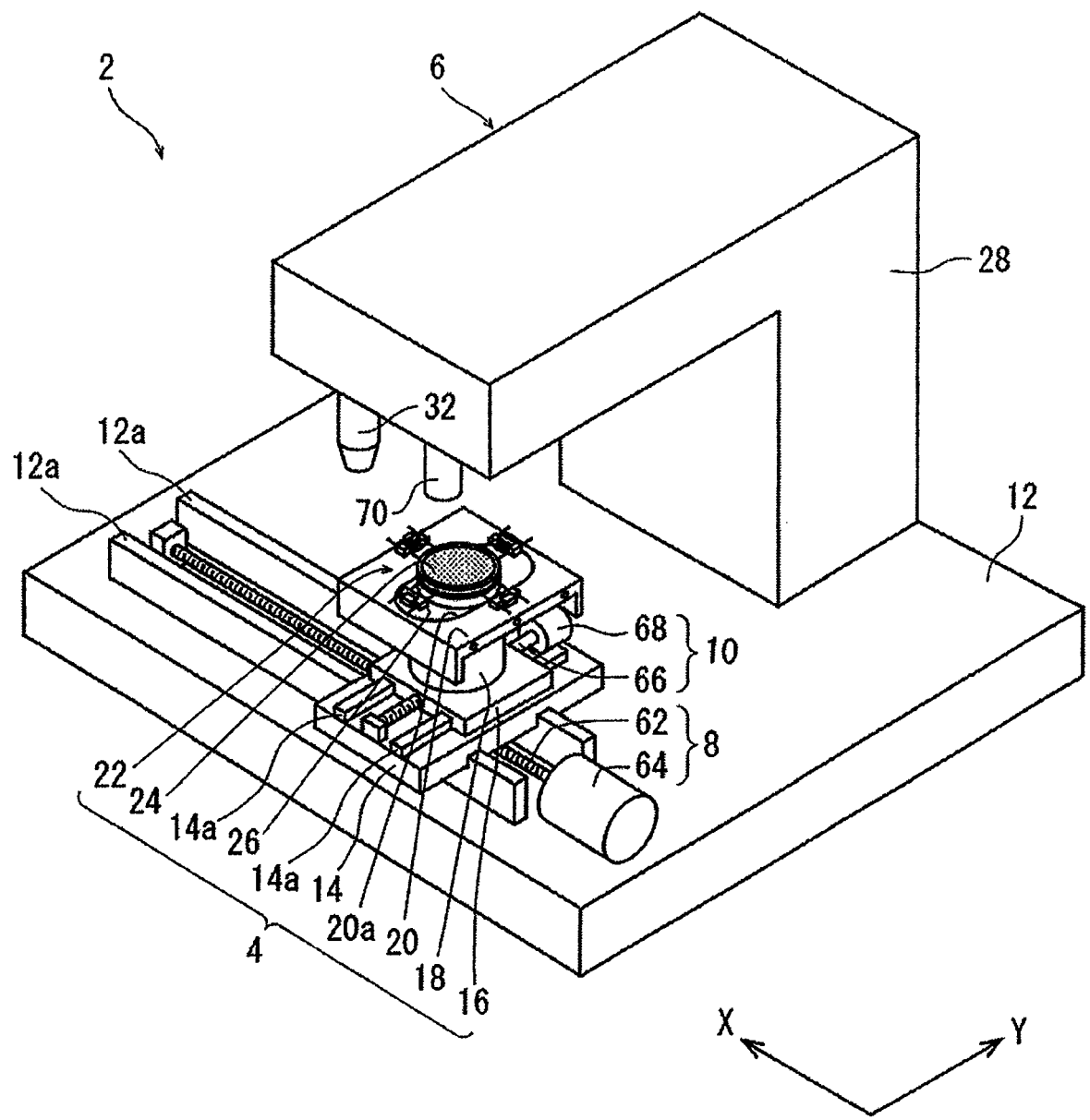
FIG. 1 is a perspective view of a laser processing apparatus according to an embodiment of the present invention.

A laser processing apparatus according to an embodiment of the present invention will hereinafter be described below with reference to the drawings. As illustrated in FIG. 1, the laser processing apparatus, denoted by 2, includes a holding unit 4 for holding a wafer, a laser beam applying unit 6 for applying pulsed laser beams to a wafer held on the holding unit 4 to form modified layers in the wafer, an X-axis feeding mechanism 8 for processing-feeding the holding unit 4 and the laser beam applying unit 6 relative to each other in X-axis directions, and a Y-axis feeding mechanism 10 for indexing-feeding the holding unit 4 and the laser beam applying unit 6 relative to each other Y-axis directions that are transverse to the X-axis directions. The X-axis directions refer to directions indicated by the arrow X in FIG. 1 whereas the Y-axis directions refer to directions indicated by the arrow Y in FIG. 1. The X-axis directions and the Y-axis directions jointly define a substantially horizontal XY plane.

As illustrated in FIG. 1, the holding unit 4 includes an X-axis movable plate 14 mounted on a base 12 for movement in the X-axis directions, a Y-axis movable plate 16 mounted on the X-axis movable plate 14 for movement in the Y-axis directions, a post 18 fixedly mounted on an upper surface of the Y-axis movable plate 16, and a cover plate 20 fixedly mounted on the upper end of the post 18. The cover plate 20 has an oblong hole 20a defined therein which is elongate in the Y-axis directions. A chuck table 22 extends upwardly through the oblong hole 20a and is rotatably mounted on the upper end of the post 18. The chuck table 22 is rotated by a chuck table motor, not illustrated, housed in the post 18. A circular porous suction chuck 24 that is connected to suction means, not illustrated, is disposed on an upper end portion of the chuck table 22. The suction means generates a suction force that acts on an upper surface of the suction chuck 24 on the chuck table 22 to hold the wafer under suction on the upper surface of the suction chuck 24. A plurality of clamps 26 that are angularly spaced at intervals are disposed on a peripheral edge of the chuck table 22 for securing the wafer to the chuck table 22.

Figure 2:
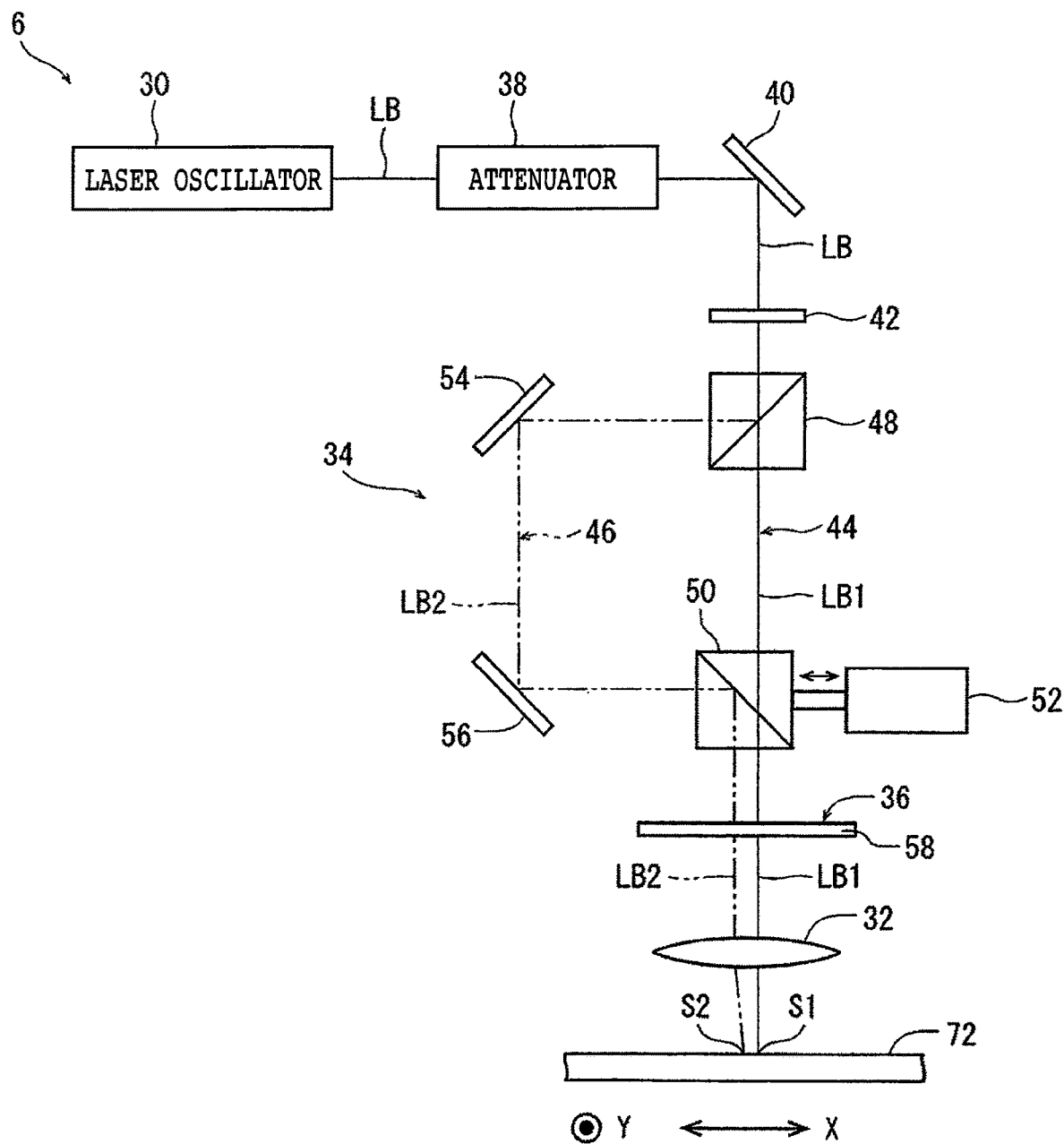
FIG. 2 is a block diagram of a laser beam applying unit of the laser processing apparatus illustrated in FIG. 1.

The laser beam applying unit 6 will hereinafter be described in detail below with reference to FIGS. 1 and 2. As illustrated in FIG. 1, the laser beam applying unit 6 includes an inverted-L-shaped frame 28 having a vertical portion extending upwardly from an upper surface of the base 12 and a horizontal portion extending substantially horizontally from the upper end of the vertical portion. As illustrated in FIG. 2, the frame 28 houses therein a laser oscillator 30 for emitting a pulsed laser beam LB having a wavelength that is transmittable through the wafer, a beam condenser 32 for converging pulsed laser beams derived from the pulsed laser beam LB emitted from the laser oscillator 30 onto the wafer held on the holding unit 4, a beam splitter assembly 34 disposed between the laser oscillator 30 and the beam condenser 32, for splitting the pulsed laser beam LB emitted from the laser oscillator 30 into at least two pulsed laser beams LB1 and LB2, to be described later, spaced in the X-axis directions, and a mask assembly 36 disposed between the laser oscillator 30, or the beam splitter assembly 34 in the embodiment, and the beam condenser 32, for reducing the width of the two pulsed laser beams LB1 and LB2 in the Y-axis directions to keep their converged spots on the wafer within the width of projected dicing lines on the wafer. In FIG. 2, the beam condenser 32 is illustrated as a condensing lens for the sake of convenience.

According to the present embodiment, the laser beam applying unit 6 also includes an attenuator 38 for adjusting the output power level of the pulsed laser beam LB emitted from the laser oscillator 30, a first mirror 40 for reflecting and guiding the pulsed laser beam LB whose output power has been adjusted by the attenuator 38 toward the beam splitter assembly 34, a half-wave plate 42 disposed between the first mirror 40 and the beam splitter assembly 34, and focal point position adjusting means, not illustrated, adjusting the vertical positions of the focal points of the pulsed laser beams LB1 and LB2 by vertically moving the beam condenser 32.

Referring further to FIG. 2, the beam splitter assembly 34 includes a first polarizing beam splitter 48 for splitting the pulsed laser beam LB that has passed through the half-wave plate 42 into a first pulsed laser beam LB1 to travel along a first beam path 44 and a second pulsed laser beam LB2 to travel along a second beam path 46, a second polarizing beam splitter 50 for guiding the first pulsed laser beam LB1 and the second pulsed laser beam LB2 toward the beam condenser 32 while keeping them spaced a distance from each other in the X-axis directions, split-interval adjusting means 52 adjusting the distance by which the first pulsed laser beam LB1 and the second pulsed laser beam LB2 are spaced from each other in the X-axis directions by horizontally moving the second polarizing beam splitter 50 in the X-axis directions, and a second mirror 54 and a third mirror 56 for reflecting and guiding the second pulsed laser beam LB2 traveling along the second beam path 46 to the second polarizing beam splitter 50.

The pulsed laser beam LB emitted from the laser oscillator 30 is adjusted to an appropriate output power level, i.e., a pulse energy level in the range of 12 to 15 µJ, by the attenuator 38, and is reflected by the first mirror 40 to fall on the half-wave plate 42. The pulsed laser beam LB includes a P-polarized component whose plane of polarization with respect to the first polarizing beam splitter 48 is a P polarization and an S-polarized component whose plane of polarization with respect to the first polarizing beam splitter 48 is an S polarization. The half-wave plate 42 adjusts, e.g., equalizes, the amount of light of the P-polarized component and the amount of light of the S-polarized component. The pulsed laser beam LB from the half-wave plate 42 is applied to the first polarizing beam splitter 48 of the beam splitter assembly 34.

Of the pulsed laser beam LB that is incident on the first polarizing beam splitter 48, the P-polarized component passes through the first polarizing beam splitter 48 and the S-polarized component is reflected by the first polarizing beam splitter 48. The P-polarized component that has passed through the first polarizing beam splitter 48 is guided as the first pulsed laser beam LB1 to travel along the first beam path 44. The S-polarized component that has been reflected by the first polarizing beam splitter 48 is guided as the second pulsed laser beam LB2 to travel along the second beam path 46. The first pulsed laser beam LB1 that travels along the first beam path 44 goes straight to the second polarizing beam splitter 50. The second pulsed laser beam LB2 that travels along the second beam path 46 is reflected by the second mirror 54 and the third mirror 56 and applied to the second polarizing beam splitter 50.

The first pulsed laser beam LB1, whose plane of polarization with respect to the second polarizing beam splitter 50 is also a P polarization, passes through the second polarizing beam splitter 50 and is guided toward the beam condenser 32. The second pulsed laser beam LB2, whose plane of polarization with respect to the second polarizing beam splitter 50 is also an S polarization, is reflected by the second polarizing beam splitter 50 and guided toward the beam condenser 32. The second polarizing beam splitter 50 is positionally adjusted by the split-interval adjusting means 52, which may be an electrically operated cylinder or the like, such that the position of the second polarizing beam splitter 50 in the X-axis direction and the position of the first polarizing beam splitter 48 in the X-axis directions are slightly different from each other, as illustrated in FIG. 2. Therefore, the first pulsed laser beam LB1 and the second pulsed laser beam LB2 that are applied to the second polarizing beam splitter 50 are guided toward the beam condenser 32 while being spaced a distance from each other in the X-axis directions. According to the present embodiment, consequently, the beam splitter assembly 34 splits the pulsed laser beam LB emitted from the laser oscillator 30 into the first pulsed laser beam LB1 and the second pulsed laser beam LB2 that are spaced from each other in the X-axis directions, thereby producing two converged spots on the wafer that are spaced a distance from each other in the X-axis directions, as described later.

Figure 3:
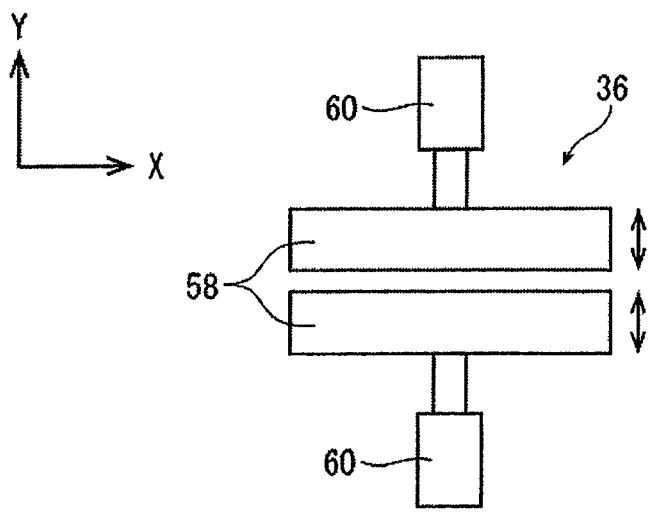
FIG. 3 is a plan view of a mask assembly of the laser processing apparatus illustrated in FIG. 1.

The mask assembly 36 of the laser beam applying unit 6 will hereinafter be described in detail below with reference to FIGS. 2 and 3. As illustrated in FIG. 2, the mask assembly 36 is disposed between the second polarizing beam splitter 50 of the beam splitter assembly 34 and the beam condenser 32. However, the mask assembly 36 may be disposed anywhere between the laser oscillator 30 and the beam condenser 32, and may be disposed upstream of the beam splitter assembly 34 with respect to the beam path of the pulsed laser beam LB. As illustrated in FIG. 3, the mask assembly 36 includes a pair of masks 58 that are spaced at intervals from each other in the Y-axis direction and a pair of gap adjusting means 60 (omitted from illustration in FIG. 2) moving the masks 58 in the Y-axis directions. By adjusting the gap between the masks 58 with the gap adjusting means 60, each in the form of an electrically operated cylinder or the like, the mask assembly 36 reduces the width in the Y-axis directions of the converged spots of the first pulsed laser beam LB1 and the second pulsed laser beam LB2 on the wafer to keep the converged spots within the width of the projected dicing lines on the wafer.

The X-axis feeding mechanism 8 will be described in detail below with reference to FIG. 1. The X-axis feeding mechanism 8 includes a ball screw 62 operatively coupled to the X-axis movable plate 14 and extending in the X-axis directions parallel to a pair of guide rails 12a on the base 12 and an electric motor 64 for rotating the ball screw 62 about its own axis. The X-axis feeding mechanism 8 operates by converting rotary motion of the electric motor 64 into linear motion and transmitting the linear motion to the X-axis movable plate 14 with the ball screw 62, thereby processing-feeding the X-axis movable plate 14 relative to the laser beam applying unit 6 in one of the X-axis directions along the guide rails 12a on the base 12.

The Y-axis feeding mechanism 10 includes a ball screw 66 operatively coupled to the Y-axis movable plate 16 and extending in the Y-axis directions parallel to a pair of guide rails 14a on the X-axis movable plate 14 and an electric motor 68 for rotating the ball screw 66 about its own axis. The Y-axis feeding mechanism 10 operates by converting rotary motion of the electric motor 68 into linear motion and transmitting the linear motion to the Y-axis movable plate 16 with the ball screw 66, thereby indexing-feeding the Y-axis movable plate 16 relative to the laser beam applying unit 6 in one of the Y-axis directions along the guide rails 14a on the X-axis movable plate 14.

As illustrated in FIG. 1, the beam condenser 32 is mounted on a lower surface of a distal end of the frame 28. An image capturing unit 70 for capturing an image of the wafer held on the chuck table 22 for detecting a region of the wafer to be processed by laser beams is also mounted on the lower surface of the distal end of the frame 28. The beam condenser 32 and the image capturing unit 70 are spaced from each other in the X-axis directions.

Figure 4:
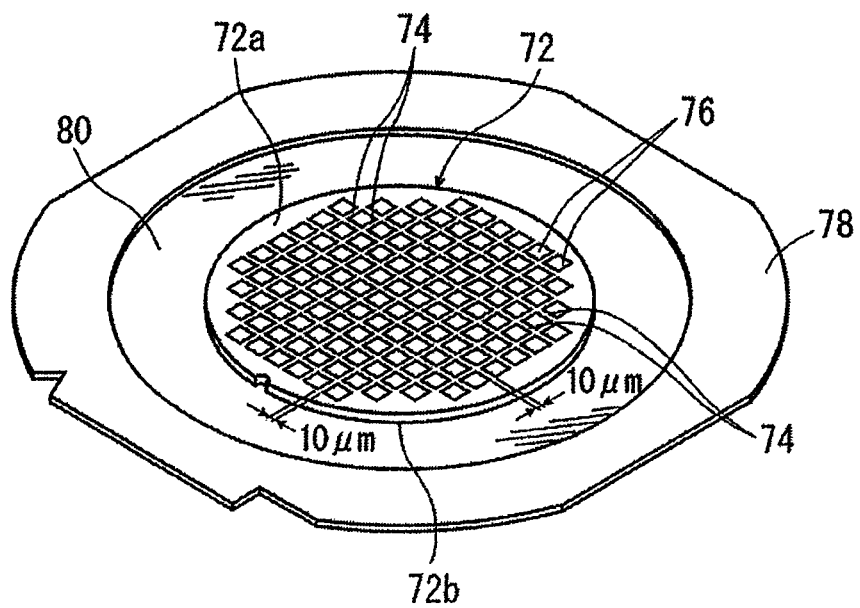
FIG. 4 is a perspective view of a wafer.

FIG. 4 illustrates a disk-shaped wafer 72 in which modified layers are to be formed by the laser processing apparatus 2. The wafer 72, which is made of silicon or the like, has a face side 72a demarcated into a plurality of rectangular areas by a grid of projected dicing lines 74 each having a relatively narrow width of approximately 10 µm, for example. A device 76 such as an IC, an LSI circuit, or the like is formed in each of the rectangular areas. According to the present embodiment, the wafer 72 has a reverse side 72b stuck to an adhesive tape 80 whose peripheral edge portion is fixed to an annular frame 78. In FIG. 4, the projected dicing lines 74, the devices 76, and other components are schematically illustrated, and the dimensions of those components, e.g., the width of the projected dicing lines 74, are exaggerated for illustrative purposes.

Operation of the laser processing apparatus 2 to form modified layers in the wafer 72 along the projected dicing lines 74 will be described in detail below. First, the wafer 72, with the face side 72a facing upwardly, is held under suction on the upper surface of the chuck table 22. The annular frame 78 is secured to the chuck table 22 by the clamps 26. Then, the image capturing unit 70 captures an image of the wafer 72 from above, i.e., an image of the face side 72a of the wafer 72. The layout, width, etc. of the projected dicing lines 74 where the wafer 72 is to be processed by laser beams are detected based on the image of the wafer 72 that has been captured by the image capturing unit 70. Then, the X-axis feeding mechanism 8, the Y-axis feeding mechanism 10, and the chuck table motor are operated to align those projected dicing lines 74 which extend parallel to each other in a first direction with the X-axis directions, and to position one of those aligned projected dicing lines 74 beneath the beam condenser 32. Thereafter, the focal point position adjusting means vertically moves the beam condenser 32 to position the focal points of the pulsed laser beams LB1 and LB2 in the wafer 72 along the projected dicing line 74 that has been positioned beneath the beam condenser 32.

Then, based on the detected width of the projected dicing line 74, the gap adjusting means 60 adjusts the gap between the masks 58 to reduce the width in the Y-axis directions of a converged spot S1 (see FIG. 5) of the first pulsed laser beam LB1 on the face side 72a of the wafer 72 and the width in the Y-axis directions of a converged spot S2 (see FIG. 5) of the second pulsed laser beam LB2 on the face side 72a of the wafer 72 to keep the converged spots S1 and S2 within the width of the projected dicing line 74. If the width of the projected dicing line 74 is approximately 10 µm, for example, the width of the converged spots S1 and S2 in the Y-axis directions is reduced to approximately 7 to 8 µm. Therefore, though the pulsed laser beam LB emitted from the laser oscillator 30 is of a circular cross-sectional shape, the converged spots S1 and S2 have their width reduced in the Y-axis directions and are of a nearly elliptical shape whose dimension in the Y-axis directions is smaller than its dimension in the X-axis directions.

Figure 5:
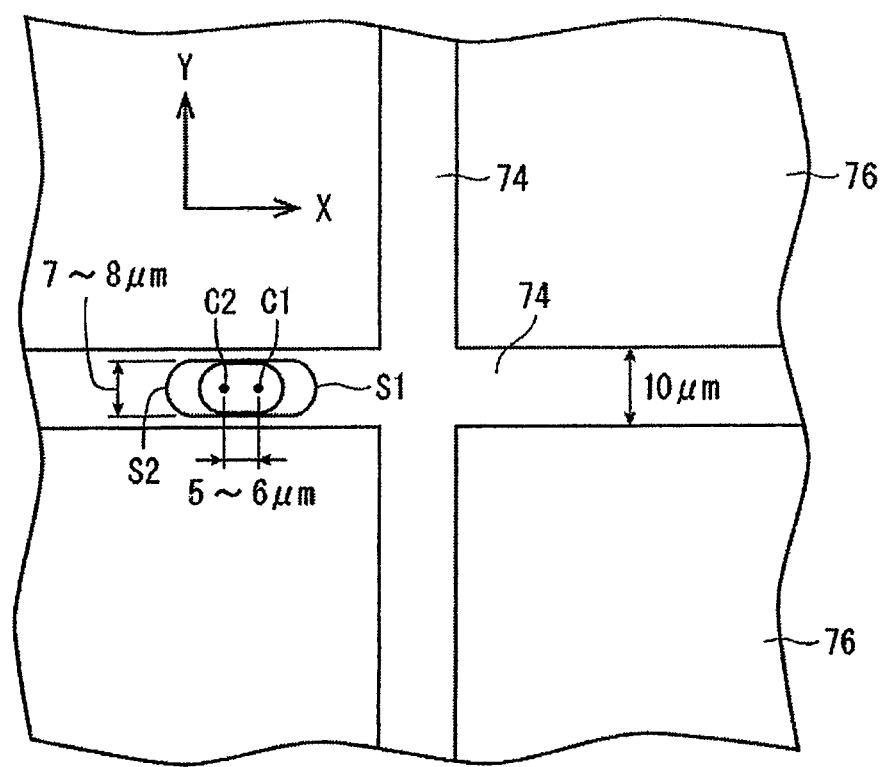
FIG. 5 is a schematic view of converged spots of pulsed laser beams on a projected dicing line on a face side of the wafer.

The split-interval adjusting means 52 of the beam splitter assembly 34 adjusts the position of the second polarizing beam splitter 50 to set the distance between a center C1 of the converged spot S1 and a center C2 of the converged spot S2 preferably to the distance by which cracks extending in the X-axis directions from adjacent modified layers are joined together. With such a distance setting, a modified layer formed in the wafer 72 by the first pulsed laser beam LB1 and a modified layer formed in the wafer 72 by the second pulsed laser beam LB2 are joined to each other by cracks extending from the modified layers, making it easier to divide the wafer 72 into individual devices 76 from the modified layers in a subsequent dividing step. According to the present embodiment, as illustrated in FIG. 5, the distance between the centers C1 and C2 of the two converged spots S1 and S2, respectively, is set to approximately 5 to 6 µm, leaving the converged spot S1 and converged spot S2 overlapping each other in the X-axis directions.

After the gap between the masks 58 has been adjusted and the position of the second polarizing beam splitter 50 has been adjusted, as described above, the pulsed laser beam LB whose wavelength is transmittable through the wafer 72 is emitted from the laser oscillator 30 at an appropriate repetitive frequency while the chuck table 22 is being processing-fed at a suitable processing feed rate in one of the X-axis directions relative to the beam condenser 32 by the X-axis feeding mechanism 8. The pulsed laser beam LB emitted from the laser oscillator 30 is split by the beam splitter assembly 34 into the first pulsed laser beam LB1 and the second pulsed laser beam LB2 that are spaced from each other in the X-axis directions. Then, the converged spot S1 on the wafer 72 of the first pulsed laser beam LB1 and the converged spot S2 on the wafer 72 of the second pulsed laser beam LB2 are reduced in width in the Y-axis directions by the mask assembly 36, as the first pulsed laser beam LB1 and the second pulsed laser beam LB2 are applied from the beam condenser 32. Since the respective width of the respective converged spots S1 and S2 on the face side 72a of the wafer 72 is smaller than the width of the projected dicing line 74, the first pulsed laser beam LB1 and the second pulsed laser beam LB2 are not applied to the devices 76 on the face side 72a of the wafer 72, and hence do not cause damage to the devices 76. In this manner, a modified layer forming step is carried out to apply the first pulsed laser beam LB1 and the second pulsed laser beam LB2 to the wafer 72 along the projected dicing line 74 to form reduced-strength modified layers, not illustrated, in the wafer 72 along the projected dicing line 74 and to cause cracks to extend from the modified layers in the wafer 72.

When the modified layer forming step is carried out, if the distance between the two converged spots S1 and S2 is in the range of 5 to 6 µm, the relative processing feed rate by the X-axis feeding mechanism 8 is represented by V (mm/s), and the repetitive frequency of the pulsed laser beam LB is represented by R (kHz), then V/R should preferably be in the following range:

the distance between the converged spots×1.4≤V/R≤the distance between the converged spots×2. If the distance between the two converged spots S1 and S2 is 5 µm and the repetitive frequency is 60 kHz, then the processing feed rate V is in the range of 420 to 600 mm/s.

Modified layers and cracks formed in the wafer 72 by the first pulsed laser beam LB1 and the second pulsed laser beam LB2 that are applied in a first sweeping cycle and modified layers and cracks formed in the wafer 72 by the first pulsed laser beam LB1 and the second pulsed laser beam LB2 that are applied in a second sweeping cycle are joined to each other. Therefore, inasmuch as the modified layers and cracks formed in the wafer 72 along the projected dicing line 74 are joined together from one end to the other of the projected dicing line 74, it is easier to divide the wafer 72 into individual device chips including the respective devices 76.

After the wafer 72 has been processed by the first and second pulsed laser beams LB1 and LB2 fully along the projected dicing line 74, the chuck table 22 is indexing-fed in an indexing feed step by a distance corresponding to the distance between adjacent projected dicing lines 74 in one of the Y-axis directions relative to the beam condenser 32 by the Y-axis feeding mechanism 10. Then, the above modified layer forming step is repeated on the wafer 72 along a next projected dicing line 74. In this manner, modified layers are formed in the wafer 72 along all the projected dicing lines 74 that have been aligned with the X-axis directions. Thereafter, the chuck table 22 is turned 90° about its own axis by the chuck table motor to align those projected dicing lines 74 which extend parallel to each other in a second direction perpendicular to the first direction, with the X-axis directions. Then, the modified layer forming step and the indexing feed step are alternatively repeated. Accordingly, modified layers are formed in the wafer 72 along all the projected dicing lines 74 extending in the second direction perpendicularly to the projected dicing lines 74 extending in the first direction.

According to the present embodiment, as described above, because the width of the converged spots S1 and S2 on the face side 72a of the wafer 72 in the Y-axis directions is smaller than the width of the projected dicing lines 74, the first pulsed laser beam LB1 and the second pulsed laser beam LB2 are not applied to the devices 76 on the face side 72a of the wafer 72. When the first pulsed laser beam LB1 and the second pulsed laser beam LB2 are applied to the wafer 72 to form modified layers therein while their focal points are being positioned in the wafer 72 along and beneath the projected dicing lines 74 each having a relatively narrow width of approximately 10 µm, for example, therefore, the first pulsed laser beam LB1 and the second pulsed laser beam LB2 do not cause damage to the devices 76 on the face side 72a of the wafer 72.

In the present embodiment, the pulsed laser beam LB is split into the first pulsed laser beam LB1 and the second pulsed laser beam LB2 to produce the respective two converged spots S1 and S2 on the face side 72a of the wafer 72. However, the laser beam applying unit 6 may include a plurality of beam splitter assemblies 34 to produce three or more converged spots on the face side 72a of the wafer 72.

Preferable processing conditions for forming good modified layers in wafers using the laser processing apparatus 2 will be described below. The inventor of the present invention conducted a plurality of experiments for forming modified layers in wafers under a range of experimental conditions set forth below, and found preferable processing conditions for forming good modified layers in wafers. Since good modified layers are formed in wafers within the range of processing conditions described below, the wafers can be properly divided into individual device chips along projected dicing lines on the wafers.

Experimental Conditions

Wavelength of the pulsed laser beam: 1064 nm
Repetitive frequency R: 60 kHz
Average output power: 0 to 1 W
Pulse energy level of the pulsed laser beam before being split: 0 to 16.7 µJ
Pulse energy level of the first pulsed laser beam: 0 to 8.3 µJ
Pulse energy level of the second pulsed laser beam: 0 to 8.3 µJ
Processing feed rate V: 0 to 1000 mm/s
V/R: 0 to 16.7 µm

[Preferable Processing Conditions]

Wavelength of the pulsed laser beam: 1064 nm
Repetitive frequency R: 60 kHz
Average output power: 0.72 to 0.9 W
Pulse energy level of the pulsed laser beam before being split: 12 to 15 µJ
Pulse energy level of the first pulsed laser beam: 6 to 7.5 µJ Pulse energy level of the second pulsed laser beam: 6 to 7.5 μJ Processing feed rate V: 420 to 720 mm/s V/R: 7 to 12 μm The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer dicing apparatus, comprising:
   a chuck table holding a wafer thereon, the wafer having a plurality of devices formed on a face side thereof in respective areas demarcated thereon by a grid of intersecting projected dicing lines;
   a laser beam applying unit applying a pulsed laser beam to the wafer held on the chuck table to form modified layers in the wafer along the projected dicing lines;
   an X-axis feeding mechanism processing-feeding the chuck table and the laser beam applying unit relative to each other in an X-axis direction; and
   a Y-axis feeding mechanism indexing-feeding the chuck table and the laser beam applying unit relative to each other in a Y-axis direction perpendicular to the X-axis direction;
   wherein the laser beam applying unit includes:
      a laser oscillator emitting the pulsed laser beam having a wavelength transmittable through the wafer,
      a beam condenser converging the pulsed laser beam emitted from the laser oscillator onto the wafer held on the chuck table,
      a beam splitter assembly disposed between the laser oscillator and the beam condenser, splitting the pulsed laser beam emitted from the laser oscillator to form at least two converged spots on the wafer that are spaced from each other in the X-axis direction, and
      a mask assembly disposed between the laser oscillator and the beam condenser, reducing a width of the converged spots on the wafer in the Y-axis direction to keep the converged spots on the wafer within a width of projected dicing lines on the wafer;
   wherein the converged spots each have a center, and wherein the distance between the centers of the two converged spots ranges from 5 to 6 μm and a processing feed rate at which the chuck table and the laser beam applying unit are fed relative to each other by the X-axis feeding mechanism is represented by V (mm/s), and a repetitive frequency of the pulsed laser beam is represented by R (kHz), wherein V/R is in the range of:
   the distance between the converged spots×1.4≤V/R≤the distance between the converged spots×2.

2. The wafer dicing apparatus according to claim 1, wherein a distance between the at least two converged spots is set to a distance by which cracks extending in the X-axis direction from adjacent modified layers are joined together.

3. The wafer dicing apparatus according to claim 2, wherein the pulsed laser beam to be split has a pulse energy level ranging from 12 to 15 μJ, and the pulsed laser beam is split by the beam splitter assembly to form two converged spots on the wafer.

4. The wafer dicing apparatus according to claim 1 wherein the beam condenser is a condensing lens.

5. The wafer dicing apparatus according to claim 1 wherein the dicing lines each have a width of approximately 10 μm.

6. The wafer dicing apparatus according to claim 5 wherein the width of the converged spots in the Y-axis directions is reduced by the mask assembly to approximately 7 to 8 μm.

7. The wafer dicing apparatus according to claim 6 wherein the converged spots overlap each other in the X-axis direction.

8. The wafer dicing apparatus according to claim 1 wherein the converged spots have a nearly elliptical shape.

9. The wafer dicing apparatus according to claim 8 wherein the converged spots overlap each other in the X-axis direction.

10. The wafer dicing apparatus according to claim 1 wherein the converged spots overlap each other in the X-axis direction.

11. The wafer dicing apparatus according to claim 10 wherein the distance between the two converged spots is set to a distance by which cracks extending in the X-axis direction from adjacent modified layers are joined together.

12. The wafer dicing apparatus according to claim 1 wherein the modified layers have reduced strength.

13. The wafer dicing apparatus according to claim 1 wherein the beam splitter assembly splits the pulsed laser beam emitted from the laser oscillator to form at least three converged spots on the wafer that are spaced from each other in the X-axis direction.

14. A wafer dicing apparatus, comprising:
    a chuck table holding a wafer thereon, the wafer having a plurality of devices formed on a face side thereof in respective areas demarcated thereon by a grid of intersecting projected dicing lines;
    a laser beam applying unit applying a pulsed laser beam to the wafer held on the chuck table to form modified layers in the wafer along the projected dicing lines;
    an X-axis feeding mechanism processing-feeding the chuck table and the laser beam applying unit relative to each other in an X-axis direction; and
    a Y-axis feeding mechanism indexing-feeding the chuck table and the laser beam applying unit relative to each other in a Y-axis direction perpendicular to the X-axis direction;
    wherein the laser beam applying unit includes:
       a laser oscillator emitting the pulsed laser beam having a wavelength transmittable through the wafer,
       a beam condenser converging the pulsed laser beam emitted from the laser oscillator onto the wafer held on the chuck table,
       a beam splitter assembly disposed between the laser oscillator and the beam condenser, splitting the pulsed laser beam emitted from the laser oscillator to form at least two converged spots on the wafer that are spaced from each other in the X-axis direction, and
    a mask assembly disposed between the laser oscillator and the beam condenser, reducing a width of the converged spots on the wafer in the Y-axis direction to keep the converged spots on the wafer within a width of projected dicing lines on the wafer;
    wherein the beam splitter assembly comprises:
       a first polarizing beam splitter for splitting the pulsed laser beam into a first pulsed laser beam to travel along a first beam path and a second pulsed laser beam to travel along a second beam path;
       a second polarizing beam splitter for guiding the first pulsed laser beam and the second pulsed laser beam toward the beam condenser while keeping them spaced a distance from each other in the X-axis directions; and split-interval adjusting means for adjusting the distance by which the first pulsed laser beam LB and the second pulsed laser beam are spaced from each other in the X-axis directions by horizontally moving the second polarizing beam splitter in the X-axis directions;

wherein the converged spots each have a center, and wherein the distance between the centers of the two converged spots ranges from 5 to 6 μm and a processing feed rate at which the chuck table and the laser beam applying unit are fed relative to each other by the X-axis feeding mechanism is represented by V (mm/s), and a repetitive frequency of the pulsed laser beam is represented by R (kHz), wherein V/R is in the range of: the distance between the converged spots×1.4≤V/R≤the distance between the converged spots×2.

15. The wafer dicing apparatus according to claim 14 wherein the beam splitter assembly further comprises:

a first mirror and a second mirror for reflecting and guiding the second pulsed laser beam traveling along the second beam path to the second polarizing beam splitter.

16. The wafer dicing apparatus according to claim 14 wherein the split-interval adjusting means comprises an electrically operated cylinder.

17. The wafer dicing apparatus according to claim 14 wherein the converged spots overlap each other in the X-axis direction.

18. The wafer dicing apparatus according to claim 14 wherein the beam splitter assembly splits the pulsed laser beam emitted from the laser oscillator to form at least three converged spots on the wafer that are spaced from each other in the X-axis direction.

19. The wafer dicing apparatus according to claim 14 wherein the distance between the two converged spots is set to a distance by which cracks extending in the X-axis direction from adjacent modified layers are joined together.

* * * * *